(12) United States Patent
Ema et al.

(10) Patent No.: US 6,709,699 B2
(45) Date of Patent: Mar. 23, 2004

(54) FILM-FORMING METHOD, FILM-FORMING APPARATUS AND LIQUID FILM DRYING APPARATUS

(75) Inventors: Tatsuhiko Ema, Kawasaki (JP); Shinichi Ito, Yokohama (JP); Katsuya Okumura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,288

(22) Filed: Sep. 25, 2001

(65) Prior Publication Data

US 2002/0037367 A1 Mar. 28, 2002

(30) Foreign Application Priority Data

Sep. 27, 2000 (JP) ........................................ 2000-295232
Sep. 28, 2000 (JP) ........................................ 2000-296089

(51) Int. Cl.⁷ ................................................. B05D 3/12
(52) U.S. Cl. ........................ 427/240; 427/294; 427/350; 427/379; 427/385.5; 427/421; 427/424; 118/52; 118/58; 118/66; 118/320; 118/323; 438/758; 438/780; 438/782
(58) Field of Search ................................ 427/240, 425, 427/424, 294, 350, 335, 379, 385.5, 421; 118/52, 320, 58, 66, 323; 438/758, 780, 782

(56) References Cited

U.S. PATENT DOCUMENTS

| 5,803,970 | A | * | 9/1998 | Tateyama et al. ............ 118/319 |
| 5,952,050 | A | * | 9/1999 | Doan .......................... 427/336 |
| 5,965,200 | A | * | 10/1999 | Tateyama et al. ............ 427/240 |
| 6,062,288 | A | * | 5/2000 | Tateyama .................... 156/584 |
| 6,063,190 | A | * | 5/2000 | Hasebe et al. ................ 118/52 |
| 6,092,937 | A | * | 7/2000 | Snodgrass et al. .......... 396/611 |
| 6,120,834 | A | | 9/2000 | Terauchi ...................... 427/96 |
| 6,410,080 | B1 | * | 6/2002 | Ito ................................ 427/8 |
| 6,416,583 | B1 | * | 7/2002 | Kitano et al. ................ 118/680 |
| 6,506,453 | B2 | * | 1/2003 | Ema et al. ................... 427/424 |
| 2001/0028920 | A1 | * | 10/2001 | Ito et al. ...................... 427/240 |

FOREIGN PATENT DOCUMENTS

| JP | 4-302414 | 10/1992 |
| JP | 7-185450 | 7/1995 |
| JP | 10-137667 | 5/1998 |

OTHER PUBLICATIONS

People's Republic of China Office Action dated Sep. 5, 2003, and English translation thereof.

* cited by examiner

Primary Examiner—Shrive P. Beck
Assistant Examiner—Kirsten Crockford Jolley
(74) Attorney, Agent, or Firm—Finnegan, Henderson, Farabow, Garrett & Dunner, L.L.P.

(57) ABSTRACT

Disclosed is a film-forming method, comprising dispensing from a dispenser nozzle a coating solution, which is prepared by adding a solid component to a solvent and controlled to be spread on the substrate in a predetermined range, onto a target substrate to be processed while relatively moving the dispenser nozzle and the target substrate so as to form a liquid film on the entire surface of the target substrate, and arranging a sucking nozzle above and apart from the target substrate such that the sucking nozzle is not in contact with the surface of the liquid film so as to permit the sucking nozzle to suck the solvent vapor right under the sucking nozzle while moving the sucking nozzle relative to the target substrate, thereby removing the solvent from the liquid film and, thus, forming a coated film.

8 Claims, 11 Drawing Sheets

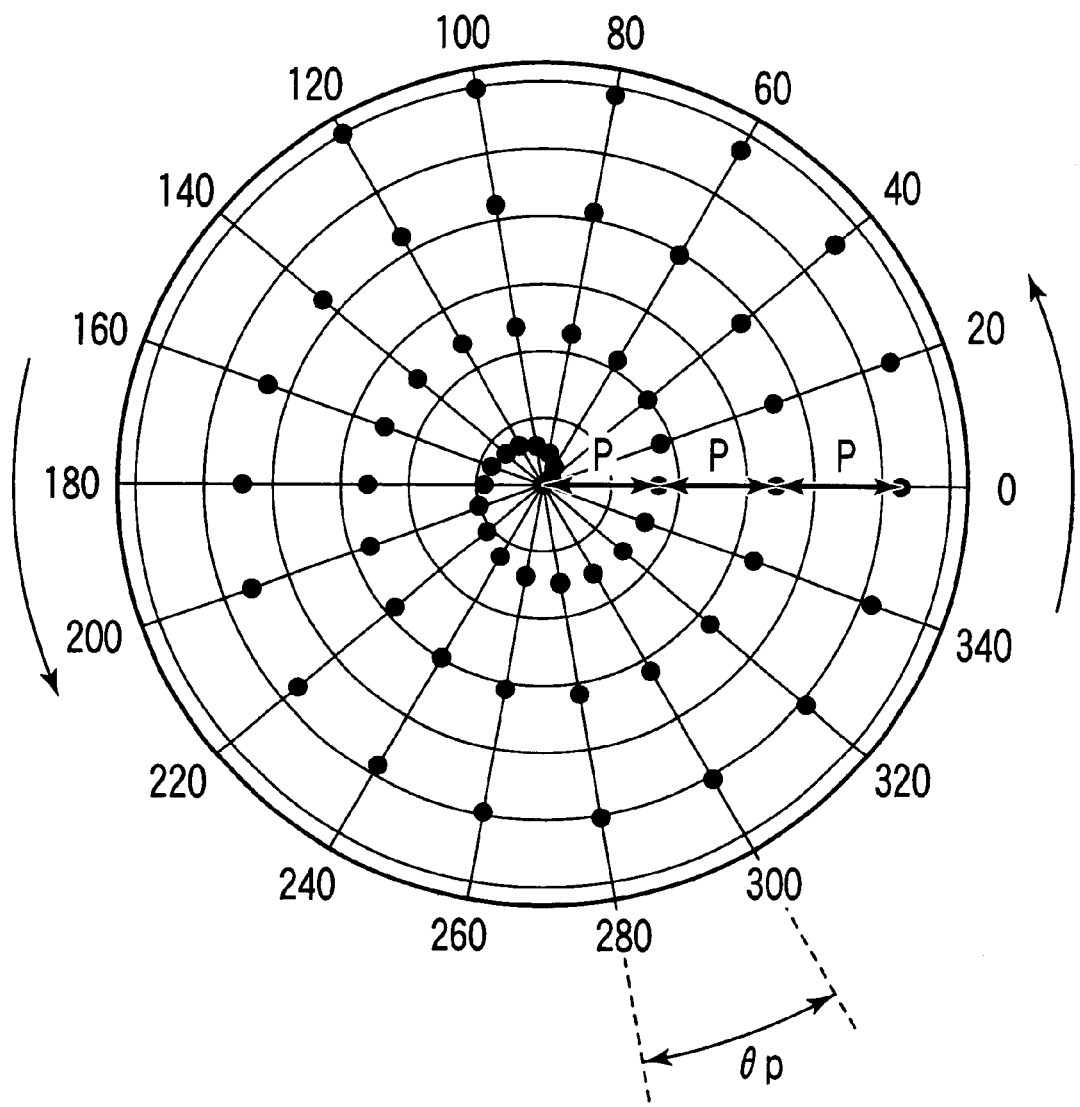
F I G. 13B

FILM-FORMING METHOD, FILM-FORMING APPARATUS AND LIQUID FILM DRYING APPARATUS

CROSS-REFERENCE TO RELATED APPLICATIONS

This application is based upon and claims the benefit of priority from the prior Japanese Patent Application No. 2000-295232, filed Sep. 27, 2000; and No. 2000-296089, filed Sep. 28, 2000.

BACKGROUND OF THE INVENTION

1. Field of the Invention

The present invention relates to a film-forming method, a film-forming apparatus, and a liquid film drying apparatus used for the coated film formation in the technology, for preparing a semiconductor device in the wafer step and in the step of preparing a mask for the optical exposure and for preparing a liquid crystal device.

2. Description of the Related Art

In the conventional spin coating method employed in a lithography step, a major portion of the coating solution dripped onto the substrate is discharged to the outside of the substrate, and a film is formed of the remaining several percent of the coating solution. As a result, a large amount of the coating solution is rendered useless, and the environment is adversely affected because a large amount of the coating solution is discharged to the outside. An additional problem to be noted is that, when it comes to a rectangular substrate or a disk-like substrate having a large diameter not smaller than 300 mm, turbulence occurs in the outer peripheral portion of the substrate, with the result that the film thickness uniformity is rendered poor this area.

A method for uniformly coating the entire substrate surface with a coating solution without wastage is known. For example, a resist is dripped from a large number of nozzles arranged to form a row, and a gas or a liquid is blown against the film-forming surface from behind the film-forming surface so as to obtain a uniform film. Also, a large number of spurting holes are formed in a rod so as to allow the resist to be dripped uniformly on the substrate and, thus, to obtain a uniform film. Further, a spray head provided with a large number of spurting holes for spraying a resist and the substrate are moved relative to each other so as to achieve a uniform coating.

In each of the conventional coating apparatuses exemplified above, a plurality of dispensing or spraying nozzles are arranged to form a lateral row and scanned along the surface of the substrate so as to form a uniform film on the substrate. Also, there is a method of forming a liquid film by scanning a single liquid discharge nozzle on a target object to be treated in addition to the coating method using an apparatus equipped with these plural nozzles.

However, the conventional coating methods exemplified above give rise to the problem that a thickness distribution of the coated film is generated from the coating starting side toward the coating finishing side. The difficulty is caused by the situation that the coating starting portion and the coating finishing portion widely differ from each other in the waiting time between completion of the coating solution dispensing operation and the drying treatment. It should also be noted that, since it was customary in the past that the step for forming the liquid film and the drying step were carried out independently, a long time was required for completing the coated film.

In the conventional step of drying a liquid film after formation of the liquid film containing a solvent of, for example, a resist film on a target substrate to be processed, employed was, for example, a baking method in which the target substrate is simply heated on a hot plate and a vacuum drying method in which a reduced pressure treatment is applied within a chamber connected to a vacuum pump.

However, in the baking method, since the evaporation of the solvent is highly sensitive to temperature, the thickness uniformity of the coated film was rendered poor, giving rise to a problem in terms of the uniformity of the film thickness.

On the other hand, in the vacuum drying method under a reduced pressure, it takes time to remove the solvent, because of low evaporation rate in reduced pressure, leading to a problem in terms of the low throughput. Also, the throughput is dependent on the properties and the dispensed amount of the solvent, making it impossible to control the processing time.

BRIEF SUMMARY OF THE INVENTION

An object of the present invention is to solve the above-noted problems inherent in the prior art.

According to a first aspect of the present invention, there is provided a film-forming method, comprising dispensing from a dispenser nozzle a coating solution, which is prepared by adding a solid component to a solvent and controlled to be spread on the substrate in a predetermined range, onto a target substrate to be processed while relatively moving the dispenser nozzle and the target substrate so as to form a liquid film on the entire surface of the target substrate; and arranging a sucking nozzle above and apart from the target substrate such that the sucking nozzle is not in contact with the surface of the liquid film so as to permit the sucking nozzle to suck the solvent vapor right under the sucking nozzle while moving the sucking nozzle relative to the target substrate, thereby removing the solvent from the liquid film and, thus, forming a coated film.

According to a second aspect of the present invention, there is provided a film-forming method, comprising forming a liquid film consisting of a coating solution prepared by adding a solid component to a solvent on the entire surface of a target substrate to be processed; arranging a disk plate having at least one through-hole in the vicinity of the target substrate such that the disk plate is not in contact with the liquid film; rotating the disk plate so as to generate a flow of gas between the target substrate and the lower surface of the disk plate; and bringing the liquid film into contact with the flow of gas so as to remove the solvent from the liquid film, thereby forming a solid phase film consisting of the solid component on the target substrate.

According to a third aspect of the present invention, there is provided a film-forming method, comprising forming a liquid film consisting of a chemical solution prepared by adding a solid component to a solvent on the entire surface of a target substrate to be processed; positioning a disk plate right above and apart from the target substrate such that the disk plate is not brought into contact with the liquid film; maintaining a reduced pressure state in the clearance between the disk plate and the target substrate and around the clearance; rotating the disk plate so as to form an flow of gas in the clearance between the target substrate and the lower surface of the disk plate; and bringing the liquid film into contact with the flow of gas so as to remove the solvent within the liquid film, thereby forming a solid phase film consisting of the solid component on the target substrate.

According to a fourth aspect of the present invention, there is provided a film-forming apparatus, comprising a dispenser nozzle arranged to face a target substrate to be processed so as to supply a chemical solution to the target substrate; a suction nozzle arranged to face the target substrate for sucking a solvent vapor on a liquid film formed on the target substrate by the supply of a chemical solution from the dispenser nozzle; a first moving section for relatively moving the target substrate and the dispenser nozzle; and a second moving section for relatively moving the target substrate and the suction nozzle.

According to a fifth aspect of the present invention, there is provided a liquid film drying apparatus, comprising a disk plate arranged to face a target substrate to be processed, a liquid film containing a solvent being formed on the surface of the target substrate, and having at least one through-hole; a rotary driving section for rotating the disk plate; an flow control plate arranged to face the disk plate on the side of the open portion of the through-hole, which is the side opposite to the side of the target substrate; and an up-down driving section for relatively changing the distance between the disk plate and the target substrate and the distance between the disk plate and the flow control plate.

Further, according to a sixth aspect of the present invention, there is provided a liquid film drying apparatus, comprising a disk plate arranged to face a target substrate to be processed, a liquid film containing a solvent being formed on the surface of the target substrate, and having at least one through-hole; a rotary driving section for rotating the disk plate; and an external gas flow generator for supplying an flow of gas into the through-hole.

BRIEF DESCRIPTION OF THE SEVERAL VIEWS OF THE DRAWING

FIGS. 13A and 13B schematically show collectively the construction of an apparatus for drying a liquid film according to a seventh embodiment of the present invention;

DETAILED DESCRIPTION OF THE INVENTION

Some embodiments of the present invention will now be described with reference to the accompanying drawings.

[First Embodiment]

Figure 1A:
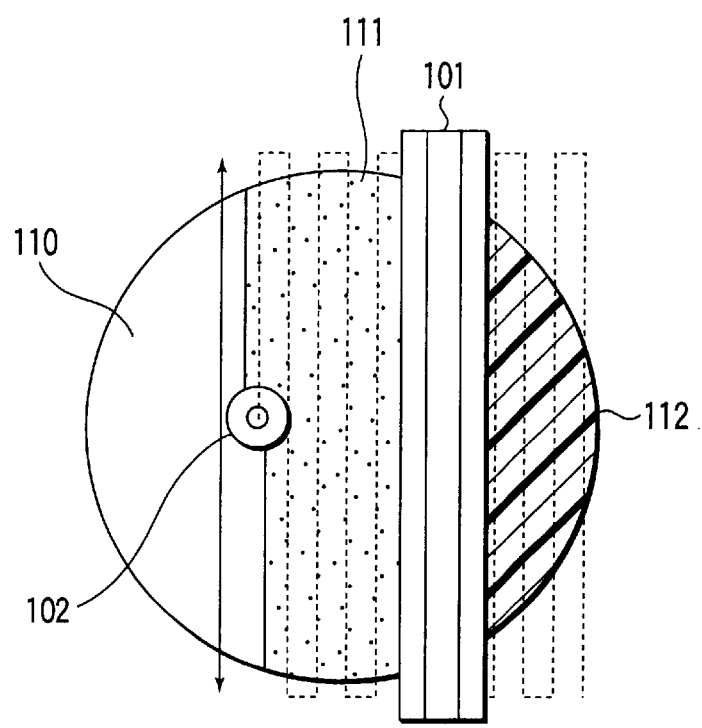
FIG. 1A is a plan view showing the construction of a film-forming apparatus according to a first embodiment of the present invention.
Figure 1B:
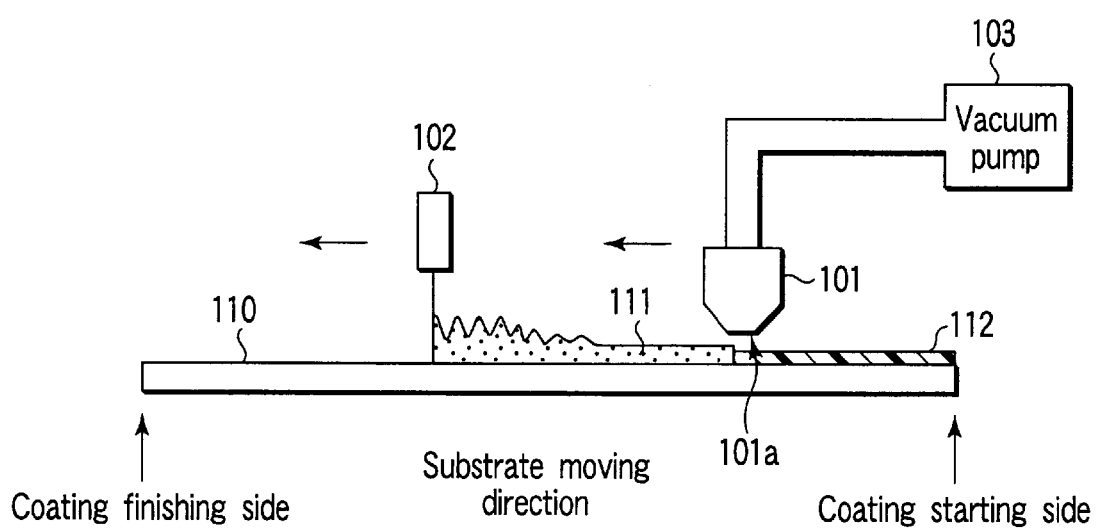
FIG. 1B is a cross sectional view showing the construction of the film-forming apparatus shown in FIG. 1A.

FIG. 1A is a plan view showing the construction of a film-forming apparatus according to a first embodiment of the present invention, and FIG. 1B is a cross sectional view showing the film-forming apparatus shown in FIG. 1A. The film-forming apparatus according to the first embodiment of the present invention is constructed to permit performing a liquid film-forming step and a drying step simultaneously.

First of all, let us describe the construction of the film-forming apparatus for forming a liquid film. As shown in FIGS. 1A and 1B, the film-forming apparatus comprises a resist dispenser nozzle 102, a nozzle moving mechanism (not shown) for moving the resist dispenser nozzle 102 in a y-direction (lateral direction), and a target substrate moving base (not shown) on which is disposed a target substrate 110 to be processed, which has a diameter of 200 mm. The target substrate moving base serves to move the target substrate 110 in the x-direction.

The construction of the apparatus for performing the drying step will now be described. As shown in FIGS. 1A and 1B, the apparatus for performing the drying step comprises a suction nozzle 101 and a vacuum pump 103 connected to the suction nozzle 101. The target substrate moving base referred to above in conjunction with the liquid film-forming step is also involved in the construction of the apparatus in the drying step.

The suction nozzle 101 includes a suction port sized at 2×220 mm. The length (220 mm) of the suction port 101a in the longitudinal direction is larger than the diameter (200 mm) of the target substrate 110. The longitudinal direction of the suction port 110a of the suction nozzle 101 is perpendicular to the moving direction of the target substrate. Since the length of the suction port 101a in its longitudinal direction is larger than the diameter of the target substrate, and the longitudinal direction of the suction port 110a is perpendicular to the moving direction of the target substrate, the entire surface of the target substrate 110 is scanned by the suction nozzle 101 in accordance with movement of the target substrate 110.

The suction nozzle 101 is positioned apart from the resist dispenser nozzle 102 so as to permit the suction nozzle 101 to perform its sucking operation after the surface of dripped liquid film 111 is rendered flat. In this resist case, the surface of the liquid film is flattened in about 30 seconds after dispensing from the dispenser nozzle 102. Since the target substrate is moved by 48 mm in 30 seconds, the resist dispenser nozzle 102 is positioned 50 mm apart from the suction nozzle 101. Incidentally, the distance between the suction nozzle 101 and the surface of the target substrate 110 was set at 1 mm so as to prevent the suction nozzle 101 from touching the liquid film 111.

Now, let us describe the liquid film forming and the drying step using the film-forming apparatus according to the first embodiment of the present invention. The liquid film forming will be described first. The resist dispenser nozzle 102 is reciprocated above the target substrate 110 in the y-direction (displayed in figure) at a speed of 1 m/sec. If the resist dispenser nozzle 102 is moved outside of the target substrate 110, the target substrate moving base is successively moved in the x-direction so as to move the target substrate 110. Under this condition, a chemically amplified type DUV resist(trade name of M20G manufactured by JSR) is successively dripped linearly from the +x side (coating starting position) of the target substrate 100 toward the −x side (coating finishing side) so as to form a liquid film 111 having a thickness of 40 $\mu$m on the substrate.

The drying will now be described. In 30 seconds after the start of the dispenser operation, the suction nozzle 101 arranged in a position remote enough to permit the dripped liquid film 111 to become flat is positioned above the target substrate 110 so as to start the drying operation. The solvent vapor above the liquid film 111 is sucked by the suction nozzle 101 so as to form a resist film (coated film) 112.

The distance between the resist dispenser nozzle 102 and the suction nozzle 101 is maintained constant, and the liquid film forming step and the solvent drying step are carried out simultaneously in accordance with movement of the target substrate 110.

According to the first embodiment of the present invention, the drying step is performed immediately after the surface of the dispensed liquid film is flattened so as to shorten the forming time of the final resist film. Also, since the waiting time from the dispensing of the chemical solution to the drying is substantially constant regardless of the dispenser position, a thickness distribution is not generated from the coating starting side to the coating finishing side.

In the film-forming method according to the first embodiment of the present invention, the size of the suction nozzle is not limited to 2×220 mm. Also, the distance between the suction nozzle and the surface of the target substrate to be processed is not limited to 1 mm. Further, the arranging distance between the suction nozzle 101 and the resist dispenser nozzle 102 is not limited to 50 mm. Still further, the moving speed of the resist dispenser nozzle 101 is not limited to 1 m/s. It should also be noted that the liquid film forming method is not limited to that in the first embodiment of the present invention. It is also possible to use a slit type resist nozzle and to employ a meniscus coating (which is the coating method forming a meniscus of resist solution between the resist nozzle and the substrate). Also, in the first embodiment of the present invention, the liquid film-forming step and the drying step are carried out simultaneously within the substrate surface. However, it is also possible to carry out the liquid film-forming step and the drying step independently. It is possible to change the operating conditions described above appropriately in accordance with the chemical solution and the process employed.

Figure 2:
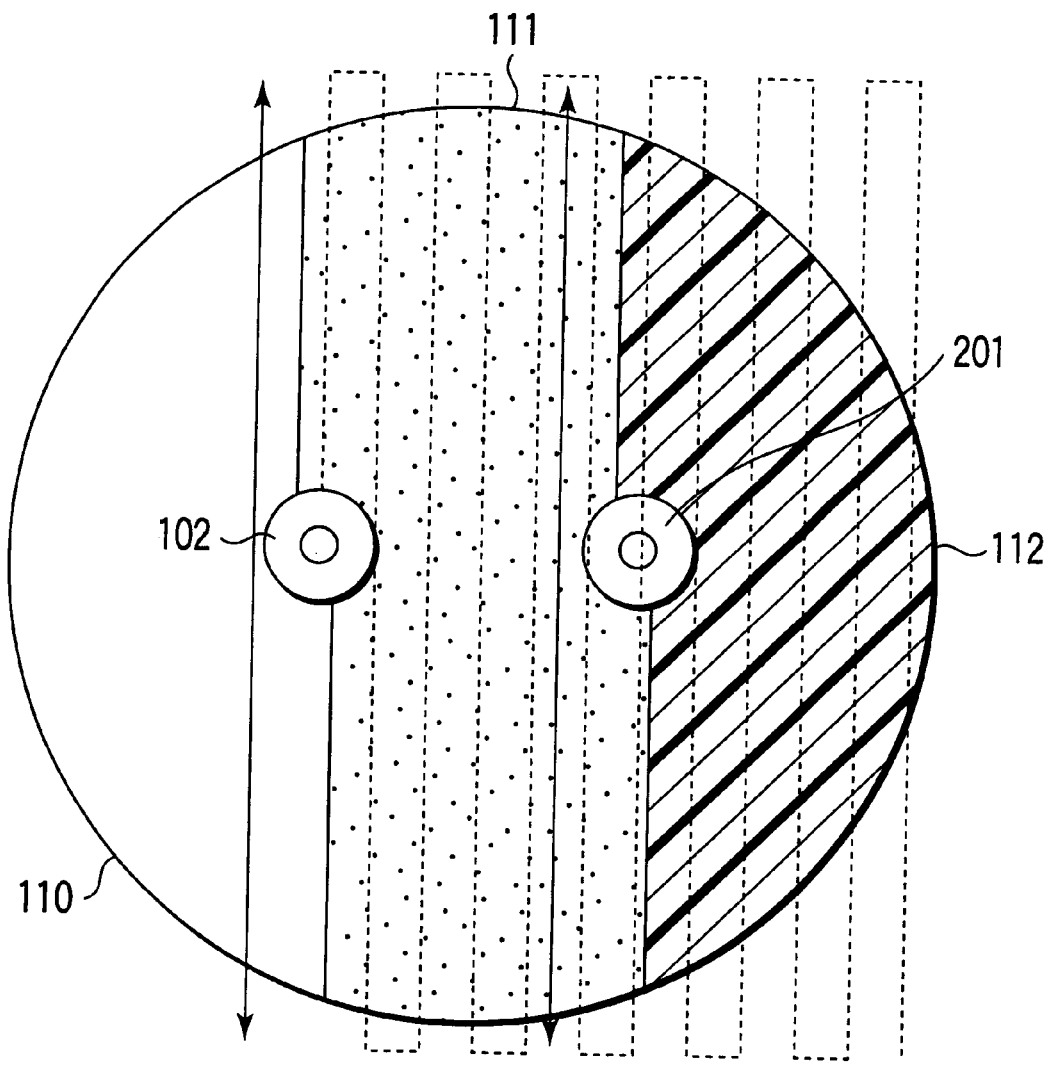
FIG. 2 is a plan view schematically showing the construction of a modification of the film-forming apparatus according to the first embodiment of the present invention.

Also, in the first embodiment described above, a slit type suction nozzle having a width larger than the diameter of the target substrate is moved in one direction. Alternatively, it is possible to use a suction nozzle smaller than the diameter of the target substrate, as shown in FIG. 2. In this case, the target substrate is moved from the dispensing starting side to the finishing side while scanning the suction nozzle in a reciprocating fashion as in the dispensing step of the resist.

[Second Embodiment]

Since the construction of the film-forming apparatus according to a second embodiment of the present invention is similar to that of the film-forming apparatus according to the first embodiment described previously with reference to FIGS. 1A and 1B, description of the film-forming apparatus is omitted. The drying step will now be described with reference to FIGS. 3A and 3B.

In the first step, a resist solution is dripped onto the target substrate 110 so as to form a liquid film 111, as in the first embodiment. Then, in accordance with movement of the target substrate 110, the suction port of the suction nozzle 101 connected to the vacuum pump 103 is positioned above the target substrate 110, with the result that the solvent vapor above the liquid film 111 is sucked so as to start the first drying treatment.

Figure 3A:
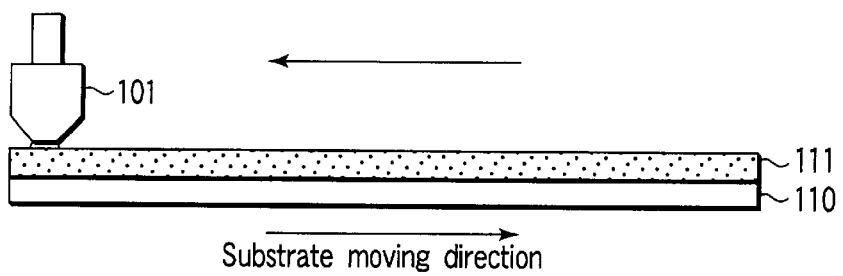
FIGS. 3A and 3B collectively show a film-forming method according to a second embodiment of the present invention.
Figure 3B:
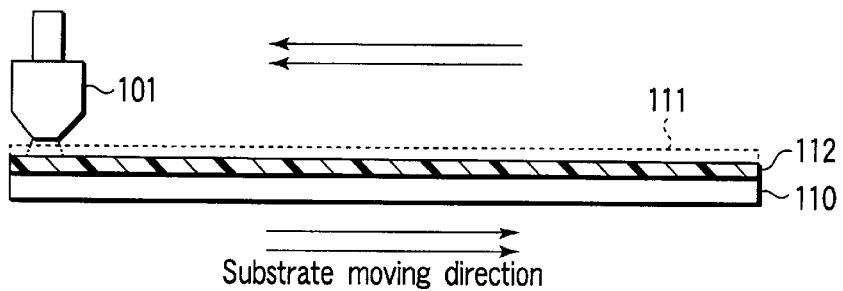

Even after the suction nozzle 101 passed through the entire surface of the liquid film 111 from the +x side (coating starting side) to the −x side (coating finishing side), the solvent remained sufficiently in the liquid film 111 and, thus, the thickness of the liquid film 111 was 10 $\mu$m (FIG. 3A). Therefore, the solvent vapor on the liquid film 111 was successively sucked again from the +x side (coating starting side) to the −x side (coating finishing side) so as to carry out a second drying treatment. The thickness of the liquid film after the second drying treatment was lowered to 5 $\mu$m. The drying treatment was repeated 8 times in total so as to dry completely the solvent in the liquid film 111, thereby forming finally a uniform resist film 112 having a thickness of 300 nm (FIG. 3B).

According to the second embodiment of the present invention, the drying treatment is repeated a plurality of times so as to gradually dry the liquid film 111, with the result that the solid component within the liquid film 111 is prevented from being sucked so as to improve the uniformity in the thickness of the resist film 112.

In the film-forming method according to the second embodiment of the present invention, the size of the suction nozzle 101 is not limited to 2×220 mm. Also, the distance between the suction nozzle 101 and the surface of the target substrate 110 is not limited to 2 mm. Further, the moving speed of the resist nozzle is not limited to 1 m/s. It should also be noted that the liquid film forming method is not limited to that in the second embodiment of the present invention. It is also possible to use a slit type resist nozzle and to employ a meniscus coating. Also, in the second embodiment of the present invention, the suction nozzle was scanned 8 times. However, the number of times of scanning is not particularly limited. It is possible to change the operating conditions described above appropriately in accordance with the chemical solution and the process employed.

Further, in the second embodiment of the present invention described above, the first drying operation was performed simultaneously with the liquid film formation. Alternatively, it is possible to start up the drying treatment after formation of the liquid film on the entire surface of the target substrate.

[Third Embodiment]

Since the construction of the film-forming apparatus according to a third embodiment of the present invention is similar to that of the film-forming apparatus according to the first embodiment described previously with reference to FIGS. 1A and 1B, description of the film-forming apparatus is omitted. The drying step will now be described with reference to FIGS. 4A and 4B.

In the first step, a chemical solution is dripped onto the target substrate 110 so as to form a liquid film 111, as in the first embodiment. In the third embodiment, however, the chemical solution which forming for an interlayer insulating film (JSR LKD series manufactured by JSR) was successively dripped so as to form a liquid film 111 having a thickness of 40 µm on the entire surface of the target substrate.

Then, in accordance with movement of the target substrate 110, the suction port of the suction nozzle 101 connected to the vacuum pump 103 is positioned above the target substrate 110, with the result that the solvent vapor above the liquid film 111 is sucked so as to start the first drying treatment from the +x side (coating starting side) to the −x side (coating finishing side).

Figure 4A:
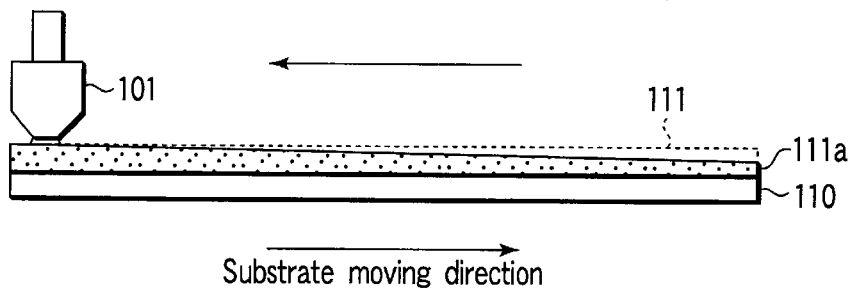
FIGS. 4A and 4B collectively show a film-forming method according to a third embodiment of the present invention.

Even after the suction nozzle 101 passed through the entire surface of the liquid film 111, the solvent remained sufficiently in the liquid film 111 and, thus, the thickness of the liquid film 111 was 10 µm. Also, the thickness of the liquid film tended to increase from the suction starting side to the suction finishing side so as to form a thickness distribution of the liquid film (FIG. 4A).

Figure 4B:
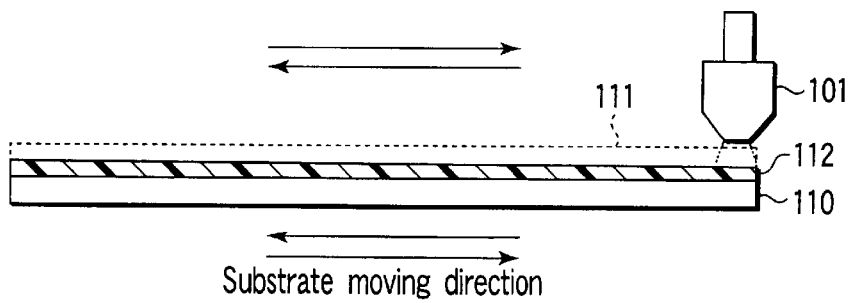

Therefore, the solvent vapor on the liquid film 111 was successively sucked in the opposite direction from the −x side (coating finishing side) to the +x side (coating starting side) so as to carry out a second drying treatment. The thickness of the liquid film after the second drying treatment was lowered to 6 µm. The reciprocating drying treatment was repeated 8 times (four times of reciprocation) so as to dry completely the solvent in the liquid film 111, thereby forming finally a uniform interlayer insulating film 112 having a thickness of 500 nm (FIG. 4B).

In other words, in the even number-th drying treatment, the suction nozzle 101 is moved relative to the target object 110 in the direction opposite to that in the odd number-th drying operation in the third embodiment of the present invention.

The chemical solution used in the third embodiment of the present invention has a relatively large fluidity and, thus, the solvent vapor is sucked from two directions so as to prevent the thickness distribution of the liquid film from being inclined in the sucking direction, thereby making the film thickness uniform over the entire target substrate.

In the film-forming method according to the third embodiment of the present invention, the size of the suction nozzle 101 is not limited to 2×220 mm. Also, the distance between the suction nozzle 101 and the surface of the target substrate 110 is not limited to 2 mm. Further, the moving speed of the resist nozzle is not limited to 1 m/s. Still further, the moving speed of the target substrate is not limited to 1.6 mm/sec. It should also be noted that the liquid film forming method is not limited to that in the third embodiment of the present invention. It is also possible to use a slit type resist nozzle and to employ a meniscus coating. Also, in the third embodiment of the present invention, the suction nozzle 101 was scanned 8 times in total (4 times of reciprocation). However, the number of times of scanning is not particularly limited. It is possible to change the operating conditions described above appropriately in accordance with the chemical solution and the process employed.

In the third embodiment of the present invention, the first drying treatment was carried out simultaneously with the liquid film formation. However, it is also possible to start up the drying treatment after formation of the liquid film on the entire surface of the target substrate.

[Fourth Embodiment]

Since the construction of the film-forming apparatus according to a fourth embodiment of the present invention is similar to that of the film-forming apparatus according to the first embodiment described previously with reference to FIGS. 1A and 1B, description of the film-forming apparatus is omitted. The drying step will now be described with reference to FIGS. 5A and 5B.

In the first step, a chemical solution is dripped onto the target substrate 110 so as to form a liquid film 111, as in the first embodiment. In the fourth embodiment, however, an interlayer insulating film (JSR LKD series manufactured by JSR) was successively dripped so as to form a liquid film 111 having a thickness of 40 µm on the entire surface of the target substrate.

Then, in accordance with movement of the target substrate 110, the suction port of the suction nozzle 101 connected to the vacuum pump 103 is positioned above the target substrate 110, with the result that the solvent vapor above the liquid film 111 is sucked so as to start the first drying treatment from the +x side (coating starting side) to the −x side (coating finishing side). Incidentally, the distance between the surface of the target substrate 110 and the suction nozzle 101 is set at 2 mm as in the first embodiment described previously.

Figure 5A:
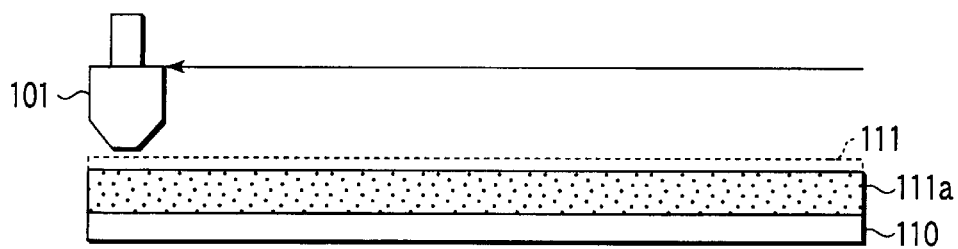
FIGS. 5A and 5B collectively show a film-forming method according to a fourth embodiment of the present invention.

Even after the suction nozzle 101 passed through the entire surface of the liquid film 111, the solvent remained sufficiently in the liquid film 111 and, thus, the thickness of the liquid film 111 was 10 µm (FIG. 5A).

Therefore, the distance between the surface of the target substrate 110 and the suction nozzle 101 was set at 1.5 mm and the solvent vapor on the liquid film 111 was successively sucked in the opposite direction from the −x side (coating finishing side) to the +x side (coating starting side) so as to carry out a second drying treatment. The thickness of the liquid film after the second drying treatment was lowered to 1 µm.

Then, the distance between the surface of the target substrate 110 and the suction nozzle 101 was set at 1 mm and the solvent vapor on the liquid film 111 was successively sucked from the −x side (coating finishing side) to the +x side (coating starting side) so as to carry out a third drying treatment. The thickness of the liquid film after the third drying treatment was lowered to 500 nm.

Figure 5B:
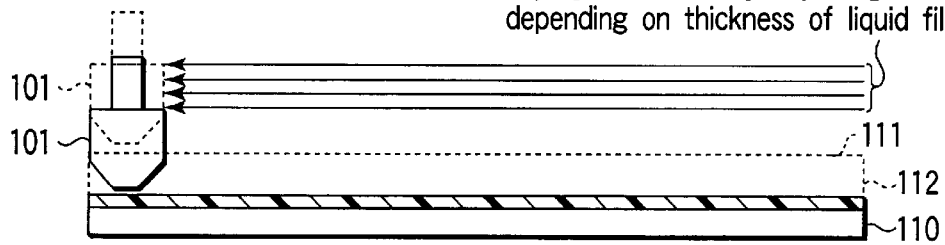

Further, the distance between the surface of the target substrate 110 and the suction nozzle 101 was set at 0.5 mm and the solvent vapor on the liquid film 111 was successively sucked from the +x side (coating starting side) to the −x side (coating finishing side) so as to carry out a fourth drying treatment. By these four drying treatments, the solvent within the liquid film 111 was completely dried so as to finally obtain a uniform resist film 112 having a thickness of 300 nm (FIG. 5B).

In the fourth embodiment of the present invention, the distance between the surface of the target substrate 110 and the suction nozzle 101 was gradually decreased in accordance with the thickness of the liquid film 111 so as to increase the drying efficiency and, thus, to form a interlayer insulating film 112 having a high uniformity.

In the film-forming method according to the fourth embodiment of the present invention, the size of the suction nozzle 101 is not limited to 2×220 mm. Also, the distance between the suction nozzle 101 and the surface of the target substrate 110 is not limited to 2 mm→1.5 mm→1 mm→0.5 mm. Further, the moving speed of the target substrate is not limited to 1.6 mm/sec. It should also be noted that the liquid film forming method is not limited to that in the fourth embodiment of the present invention. It is also possible to use a slit type resist nozzle and to employ a meniscus coating. Also, in the fourth embodiment of the present invention, the suction nozzle 101 was scanned 4 times while gradually decreasing the distance between the surface of the target substrate and the suction nozzle 101. However, the number of times of scanning is not particularly limited. Also, in the fourth embodiment, the suction nozzle 101 was scanned in one direction. However, it is also possible to employ a reciprocating scanning. The operating conditions described above can be changed appropriately in accordance with the chemical solution and the process employed.

In the fourth embodiment of the present invention described above, the first drying treatment was carried out simultaneously with formation of the liquid film. However, it is also possible to start up the drying treatment after formation of the liquid on the entire surface of the target substrate.

[Fifth Embodiment]

Since the construction of the film-forming apparatus according to a fifth embodiment of the present invention is similar to that of the film-forming apparatus according to the first embodiment described previously with reference to FIGS. 1A and 1B, description of the film-forming apparatus is omitted. However, since the fifth embodiment differs from the first embodiment in the construction of the suction nozzle 101, the construction of the suction nozzle 101 in the fifth embodiment will now be described.

Figure 6:
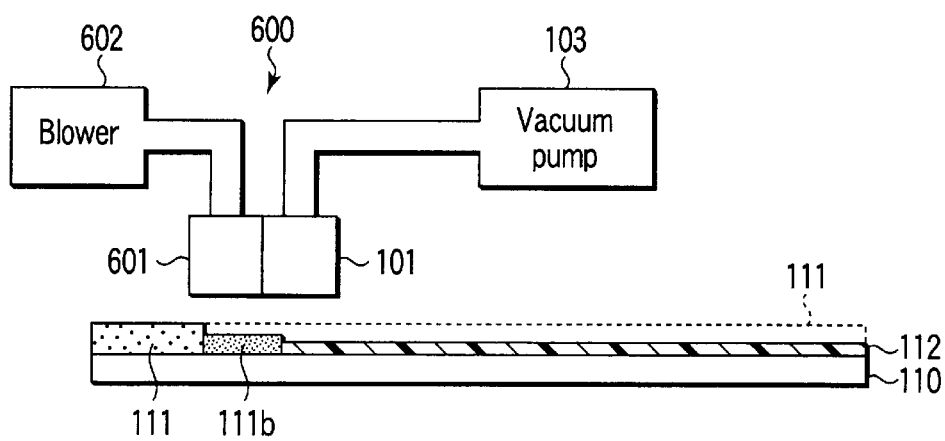
FIG. 6 schematically shows the construction of a nozzle for drying a liquid film included in a film-forming apparatus according to a fifth embodiment of the present invention.

FIG. 6 shows the construction of the suction nozzle 101 according to the fifth embodiment of the present invention. The members of the suction nozzle 101 common with FIGS. 6 and 1 are denoted by the same reference numerals so as to avoid an overlapping description.

As shown in FIG. 6, a slit type supply nozzle of airflow 601 having the air blowing port connected to an air blower (airflow supplier) 602 is connected to a slit type suction nozzle 101 (2×220 mm) connected to the vacuum pump 103. Incidentally, in the following description, the structure including the suction nozzle 101 and the airflow supply nozzle are called a liquid film drying nozzle 600.

As shown in FIG. 6, the liquid film drying nozzle 600 was arranged such that the airflow supply nozzle 601 and the suction nozzle 101 were positioned on the upstream side and the downstream side, respectively, of a scan direction. Also, the distance between the liquid film drying nozzle 600 and the surface of the target substrate 110 was set at 1 mm so as to prevent the liquid film drying nozzle 600 from being brought into contact with the liquid film 111.

The formation and the drying step of the liquid film 111 using the film forming apparatus of the particular construction will now be described. Specifically, the resist dispenser nozzle is reciprocated in the y-direction over the target substrate 110 at a speed of 1 m/s. If the resist dispenser nozzle is positioned outside the target substrate 110, the target substrate 110 is successively moved in the x-direction. Under this state, a chemically amplified type DUV resist (trade name of M20G manufactured by JSR) is successively dripped from the +x side (coating starting side) to the −x side (coating finishing side) of the target substrate 110 so as to form a liquid film 111 having a thickness of 40 µm on the entire surface of the target substrate 110.

After formation of the liquid film 111a on the entire surface of the target substrate 110, the target substrate 110 is scanned relative to the liquid film drying nozzle from the coating starting side to the coating finishing side. In this step, an airflow is supplied from the airflow supply nozzle 601 toward the liquid film 111b, and the airflow passing over the liquid film 111 and containing the solvent is sucked by the suction nozzle 101. Further, the airflow is generated over the liquid film 111 between the blowing port of the airflow supply nozzle 601 and the suction port of the suction nozzle 101 so as to dry the solvent in the liquid film 111 and, thus, to form a uniform resist film 112 having a thickness of 300 nm.

In the fifth embodiment of the present invention, the drying efficiency can be improved by adding the stream of the airflow. Also, in the fifth embodiment of the present invention, the drying state of the liquid film 111 is controlled by the supply of the airflow in advance in the case of using a chemical solution having a very large fluidity so as to prevent the suction nozzle 101 from directly sucking the chemical solution.

Figure 7A:
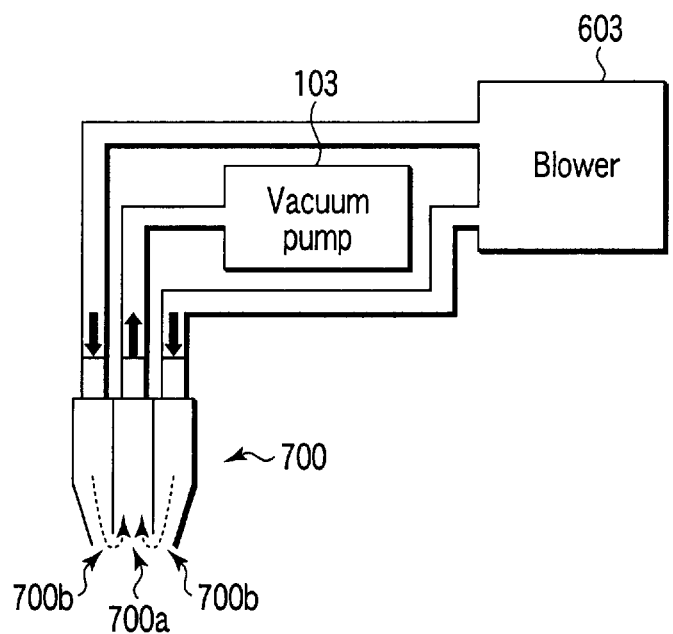
FIGS. 7A and 7B schematically show collectively the construction of a modification of the nozzle for drying a liquid film included in the film-forming apparatus according to the fifth embodiment of the present invention.
Figure 7B:
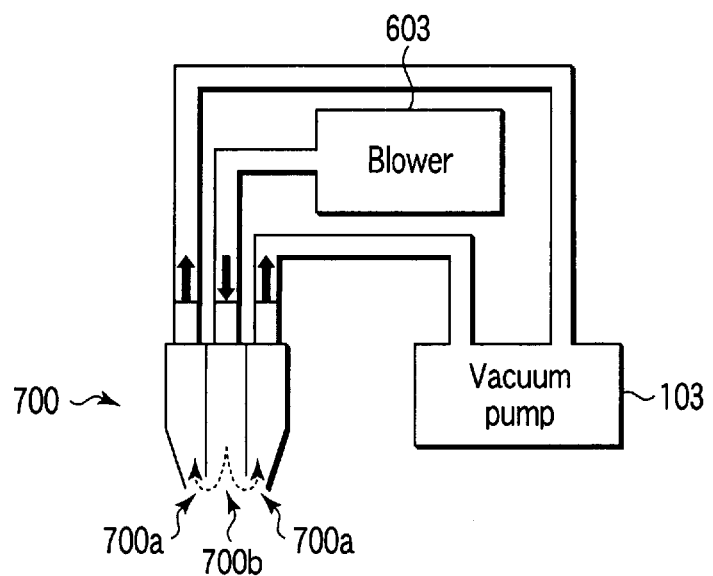

In the fifth embodiment of the present invention, the liquid film formation and the drying treatment were carried out independently. However, it is also possible to carry out the formation of the liquid film and the drying treatment simultaneously with a predetermined time difference. It is also possible to carry out the drying treatment a plurality of times (one direction, reciprocation). Also, in the fifth embodiment of the present invention, a single airflow supply nozzle was arranged on one side, and a single suction nozzle 101 was arranged on the other side. However, it is also possible to use a liquid film drying nozzle 700 in which air blowing ports 700b are arranged on both sides of a suction port 700a, and the suction nozzle and the airflow supply nozzle are formed integral as shown in FIG. 7A. It is also possible to use a liquid film drying nozzle 700 in which suction ports 700a are arranged on both sides of an air blowing port 700b and the suction nozzle and the airflow supply nozzle are formed integral as shown in FIG. 7B. Incidentally, reference numeral 103 in FIGS. 7A and 7B represents a vacuum pump, and reference numeral 603 represents a blower.

In the film-forming method according to the fifth embodiment of the present invention, the size of the suction nozzle 101 is not limited to 2×220 mm. Also, the distance between the suction nozzle 101 and the surface of the target substrate 110 is not limited to 1 mm. Further, the moving speed of the resist nozzle is not limited to 1 m/s. It should also be noted that the liquid film forming method is not limited to that in the fifth embodiment of the present invention. It is also possible to use a slit type resist nozzle and to employ a meniscus coating. It is possible to change the operating conditions described above appropriately in accordance with the chemical solution and the process employed.

[Sixth Embodiment]

Figure 8:
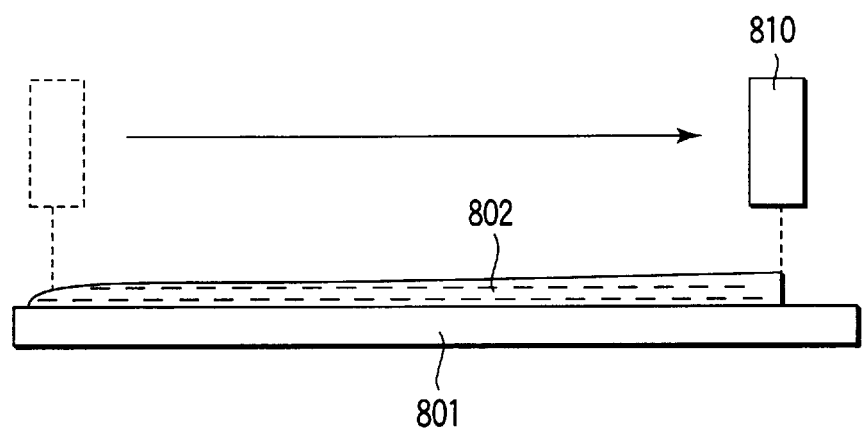
FIG. 8 shows a method of forming a liquid film according to a sixth embodiment of the present invention.

Prior to description of the drying apparatus and the drying method of the present invention, formation of a liquid film will be described with reference to FIG. 8. FIG. 8 shows how to form a liquid film (resist film) in the sixth embodiment of the present invention.

As shown in FIG. 8, a chemical solution dispenser nozzle 810 was reciprocated above a target substrate 801 in the y-direction at a speed of 1 m/s, and the target substrate having a diameter of 200 mm was successively moved in the x-direction. Under this condition, the chemical solution was linearly dispensed onto the target substrate so as to form a liquid film 802 containing resist A (solid component) on the entire surface of the target substrate 801.

Figure 9:
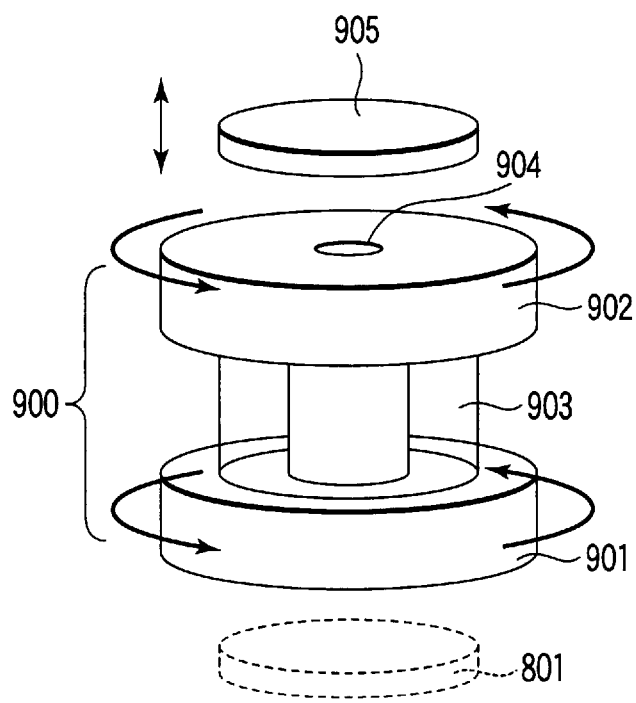
FIG. 9 schematically shows the construction of an apparatus for drying a liquid film according to the sixth embodiment of the present invention.

Then, the solvent in the liquid film was dried by an airflow generated by rotating a disk plate having a rotary mechanism. FIG. 9 schematically shows the construction of the liquid film drying apparatus.

As shown in FIG. 9, a disk plate 900 comprises a first disk 901 arranged to face the target substrate 801 and having a diameter of 250 mm and a second disk 902 arranged to face the first disk 901 with a rotary driving section 903 interposed therebetween and having a diameter of 250 mm. An air stream introducing port 904 having a diameter of 20 mm extends through the central portions of the first disk 901, the rotary driving section 903 and the second disk 902. Further, a target substrate 801 having a driving section for driving the target substrate 801 in the Z-direction is arranged to face the first disk 901 apart from the first disk 901. Still further, an airflow conductance control plate 905 equal in diameter to the target substrate 801 is arranged to face the second disk 902 apart from the second disk 902.

The drying method using the liquid film drying apparatus of the construction described above will now be described.

In the first step, the disk plate 900 was arranged above the target substrate 801 having a liquid film 802 formed thereon with a gap of 20 mm provided between the liquid film 802 and the disk plate 900. Then, the distance between the airflow conductance control plate 905 and the disk plate 900 was set at 30 mm, which was greater than the distance of 20 mm between the target substrate 801 and the disk plate 900. Under this condition, the disk plate 900 was rotated at an angular speed of 3,000 rpm for 5 seconds.

Figure 10:
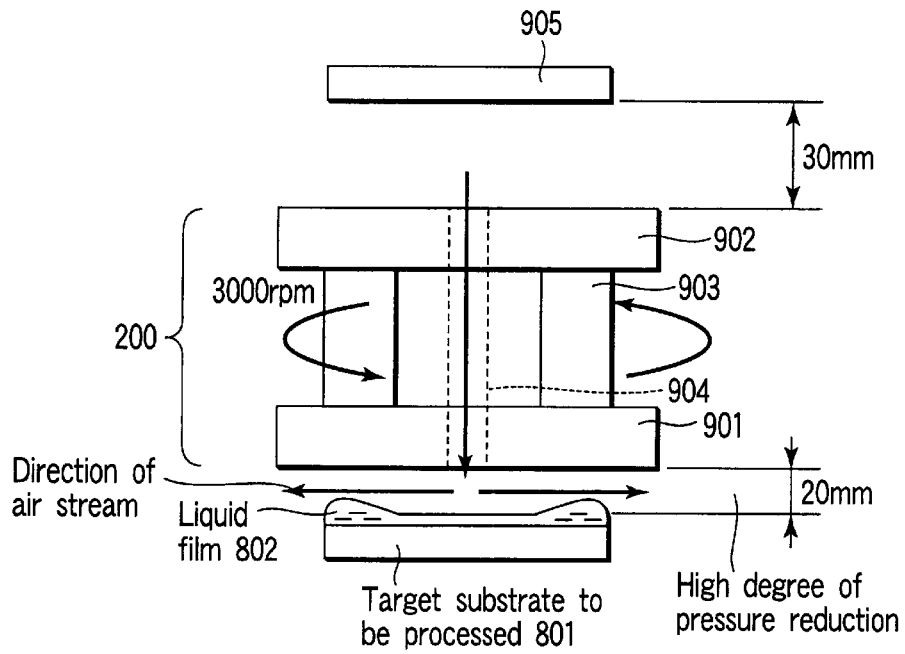
FIG. 10 shows the drying method using the apparatus for drying a liquid film shown in FIG. 9.

It should be noted that, during rotation of the disk plate 900, the degree of pressure reduction in the clearance between the target substrate 801 and the disk plate 900 is rendered greater than that in the clearance between the disk plate 900 and the airflow conductance control plate 905. Because of the difference in the degree of the pressure reduction noted above, the air is introduced into the air stream introducing port 904 from the open portion on the side of the second disk 902 and is discharged from the air introducing port 904 through the open portion on the side of the first disk 901. It follows that a downstream of the air is formed within the air stream introducing port 904, as shown in FIG. 10. As a result, an airflow from the central portion toward the outer peripheral portion is formed in the clearance between the target substrate and the first disk 901. Also, the liquid film 802 on the target substrate 801 is dried from the central portion toward the outer peripheral portion by the airflow through the clearance formed between the target substrate 801 and the first disk 901.

Figure 11:
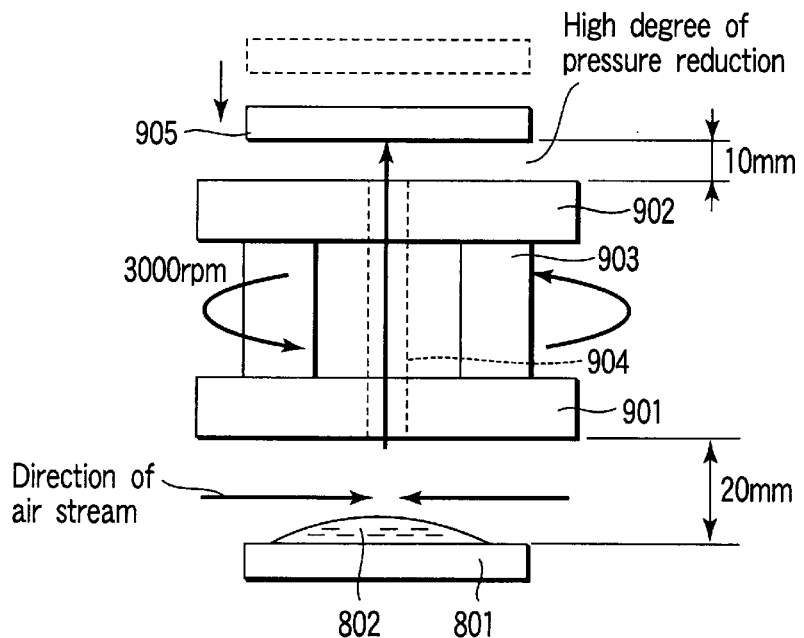
FIG. 11 shows the drying method using the apparatus for drying a liquid film shown in FIG. 9.
Figure 12:
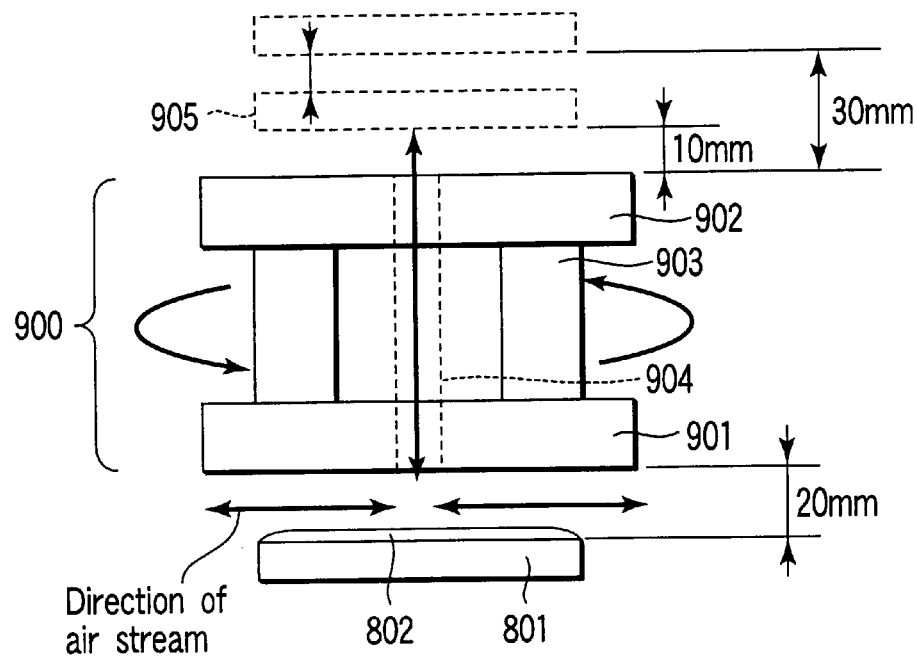
FIG. 12 shows the drying method using the apparatus for drying a liquid film shown in FIG. 9.

Then, as shown in FIG. 11, the distance between the airflow conductance control plate 905 and the disk plate 900 is set at 10 mm, which is smaller than the distance of 20 mm between the target substrate and the disk plate, and the disk plate 900 is rotated under this state at an angular speed of 3,000 rpm for 5 seconds.

In this case, the degree of pressure reduction in the clearance between the target substrate and the disk plate is rendered smaller than that in the clearance between the disk plate and the airflow conductance control plate. As a result, the air is sucked into the air stream introducing port 904 through the open portion on the side of the first disk 901 and is discharged from within the air stream introducing port 904 through the open portion on the side of the second disk 902 so as to form an airflow upward within the air stream introducing port 904 of the disk plate 900. In this case, an airflow from the outer peripheral portion toward the central portion is formed in the clearance between the target substrate and the first disk 901. It follows that the liquid film 802 formed on the target substrate 801 is dried from the outer peripheral portion toward the central portion by the airflow through the clearance between the target substrate and the first disk 901.

The steps described above were alternately repeated 6 times so as to dry the solvent in the liquid film 802 for 60 seconds in total. Finally, the lower surface of the disk plate 900 was moved apart from the surface of the target substrate 801 so as to form a uniform coated film (solid phase film) of resist A in a thickness of 300 nm on the entire surface of the target substrate without forming a thickness distribution in the flowing direction of the airflow.

In the sixth embodiment of the present invention, the distance between the disk plate 900 and the airflow conductance control plate 905 was changed so as to alternately change the direction of the airflow above the liquid film 802, thereby forming a uniform coated film free from the thickness distribution in the direction of the airflow.

Also, by setting appropriately the angular rotating speed of the disk plate and the distance between the target substrate and the disk plate, the processing time can be controlled without being affected by the properties and the dispensed amount of the solvent so as to improve the throughput.

Incidentally, in the liquid film drying method according to the sixth embodiment of the present invention, the relationship between the time and the distance between the disk plate and the target substrate or between the disk plate and the airflow conductance control plate is not limited to that described above. Also, the angular rotating speed of the disk plate is not limited to 3,000 rpm. It is possible to determine appropriately the particular relationship and the angular rotating speed noted above depending on the chemical solution used.

Also, in the sixth embodiment described above, the airflow conductance control plate was moved to make the distance between the disk plate and the target substrate larger or smaller than the distance between the disk plate and the airflow conductance plate. However, it is also possible to move the disk plate with the target substrate and the airflow conductance control plate held stationary.

Further, in the sixth embodiment of the present invention, a scan coating method was employed for forming a liquid film. However, it is also possible to employ other liquid film forming methods including a spiral coating method in which a chemical solution is dispensed spirally from the central portion toward the outer peripheral portion and vice versa.

[Seventh Embodiment]

A liquid film of resist A was formed on the entire surface of a target substrate as in the sixth embodiment described above.

Figure 13A:
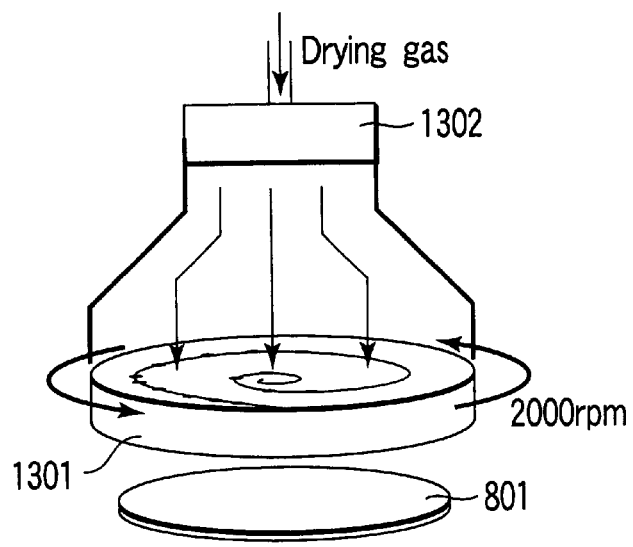

Then, the solvent of the liquid film was dried by using a disk plate 1301 having a rotary mechanism, as shown in FIGS. 13A and 13B.

As shown in FIGS. 13A and 13B, the disk plate 1301 is a disk arranged to face a target substrate 801 and having a diameter of 120 mm. Through-holes 1303 each having a diameter $\phi$ of 5 mm are spirally arranged in the disk plate 1301 at a pitch proportional to the distance from the center of the disk plate 1301. An airflow supplier 1302 capable of controlling the pressure at a predetermined level of, for example, 1.5 kg/cm$^2$, which is higher than the atmospheric pressure, is connected to that surface of the disk plate 1301 which is positioned on the side opposite to the side of the target substrate 801.

As described above, through-holes 1303 are spirally arranged in the disk plate 1301 at a pitch proportional to the distance of the through-hole from the center of the disk plate 1301. The pitch of the through-holes 1303 is determined to permit the same number of through-holes per unit time to pass through a region above the target substrate 801 regardless of the radial position of the target substrate 801.

the through-holes are arranged on a spiral curve expressed by Equation $r=p\cdot\theta/(2\pi)$ in polar coordinates $(r, \theta)$. p represents the pitch of spiral curve. Relationship between position of (n−1) th through-hole and that of n th through-hole is expressed by Equation $r_n=p\cdot(\theta_{n-1}+\theta_p)(2\pi)$.

Here, $\theta_p$ represents the angle pitch of the through-holes.

In this case, the angle pitch of the through-hole and the pitch of spiral curve are applied to 20° and 36 mm respectively showing on FIG. 13B.

Let us describe the drying step using the drying apparatus shown in FIGS. 13A and 13B.

Figure 14:
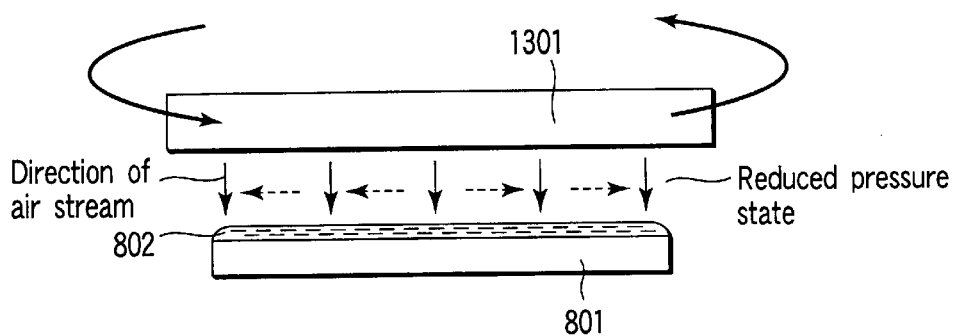
FIG. 14 shows the drying method using the apparatus for drying a liquid film shown in FIGS. 13A and 13B.

As shown in FIG. 14, the disk plate 1301 was arranged 10 mm above the liquid film 802 and rotated at an angular speed of 2,000 rpm in the direction denoted by arrows in the drawing (the direction opposite to the winding direction of the spiral arrangement of the through-holes) for carrying out the drying treatment for 60 seconds, thereby drying the liquid film. Then, the disk plate 1301 was moved away from the surface of the target substrate 801 so as to finally form a coated film of resist B having a thickness of 300 nm.

In the seventh embodiment of the present invention, the liquid film 802 formed on the target substrate 801 is kept in contact with the air stream spurted vertically from the spirally arranged through-holes 1303 formed in the disk plate 1301. The air stream spurted from the through-holes is smoothly discharged spirally toward the outer peripheral portion of the substrate so as to dry the liquid film. A coated film having a very uniform thickness over the entire region of the target substrate was obtained in the process described above.

In the seventh embodiment described above, an airflow supplier was arranged above the disk plate so as to set the air pressure at a level higher than the atmospheric pressure. As a result, the spurting rate of the air stream was increased so as to improve the drying efficiency. Alternatively, it is possible for the airflow supplier not to be arranged in some cases such that the air stream from the through-holes is generated by only the pressure reduction in the clearance between the target substrate and the lower surface of the disk plate, said pressure reduction being caused by the rotation of the disk plate. Also, it is possible to adjust appropriately the number of through-holes formed in the disk plate, the diameter of the through-hole, the arranging pitch of the through-holes and the gap depending on the chemical solution used.

Further more, it is also possible to use other gases (for example, N2 gas etc.)for airflow supplier.

Further, in the seventh embodiment of the present invention, a scan coating method was employed for forming a liquid film. However, it is also possible to employ other liquid film forming methods including a spiral coating method in which a chemical solution is dispensed spirally from the central portion toward the outer peripheral portion and vice versa.

[Eighth Embodiment]

A liquid film of resist A was formed on the entire surface of the target substrate by linearly dispensing a chemical solution on the entire surface of the target substrate having a diameter φ of 200 mm while reciprocating a very small nozzle above the target substrate in the y-direction at a speed of 1 m/s and successively moving the target substrate in the x-direction.

Figure 15:
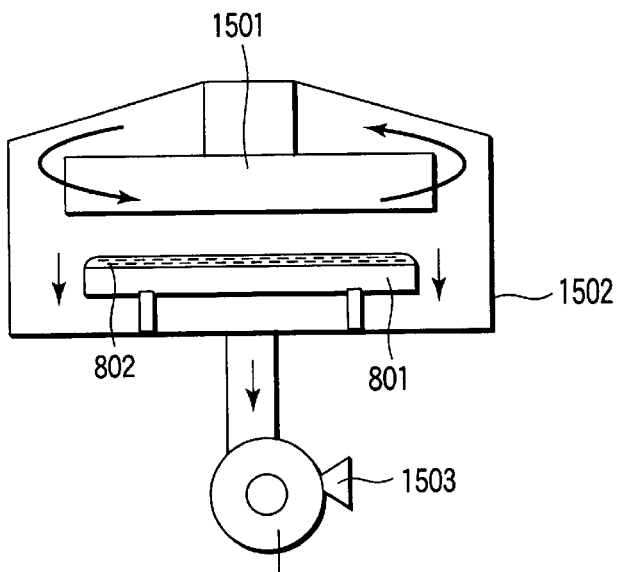
FIG. 15 schematically shows the construction of an apparatus for drying a liquid film according to an eighth embodiment of the present invention.

Then, the liquid film was dried by using a drying apparatus shown in FIG. 15. Specifically, FIG. 15 schematically shows the construction of the drying apparatus according to the third embodiment of the present invention.

As shown in FIG. 15, the target substrate 801 is arranged to face a rotary disk plate (disk) 1501 arranged within a chamber 1502. The chamber 1502 is connected to a vacuum pump 1503 and, thus, the pressure within the chamber 1502 can be lowered.

Let us describe the drying step using the drying apparatus shown in FIG. 15.

In the first step, the distance between the target substrate 801 and the disk plate 1501 is set at 5 mm, and the pressure within the chamber 1502 is lowered at a predetermined rate (−15 Torr/sec) by operating the vacuum pump 1503. Then, when the pressure within the chamber 1502 was lowered to reach about 2 Torr, which is the saturation vapor pressure of the solvent, drying of the solvent was performed by rotating the disk plate at 2,000 rpm for 30 seconds.

In the next step, the disk plate 1501 was moved away from the surface of the target substrate 801 and taken out of the chamber 1502 so as to finally form a coated film of resist C having a thickness of 300 nm on the target substrate 801.

Figure 16:
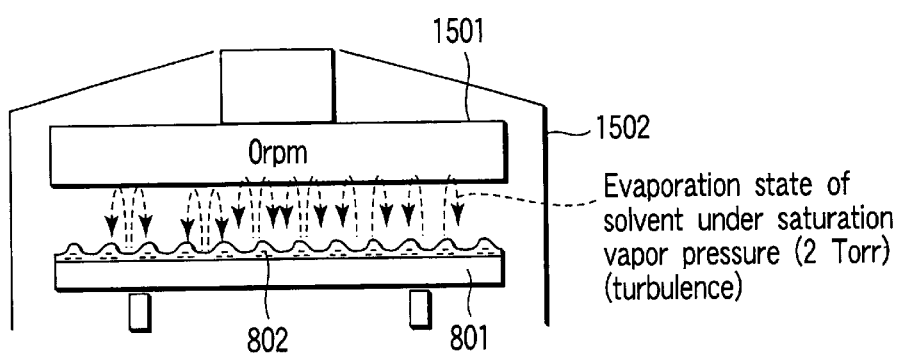
FIG. 16 shows the problem inherent in the conventional reduced pressure drying method.

In the conventional reduced pressure drying method, the evaporated solvent forms a turbulence under the state of the saturation vapor pressure of the solvent so as to give rise to the problem in the surface state and the uniformity in the thickness of the liquid film 802, as shown in FIG. 16.

Figure 17:
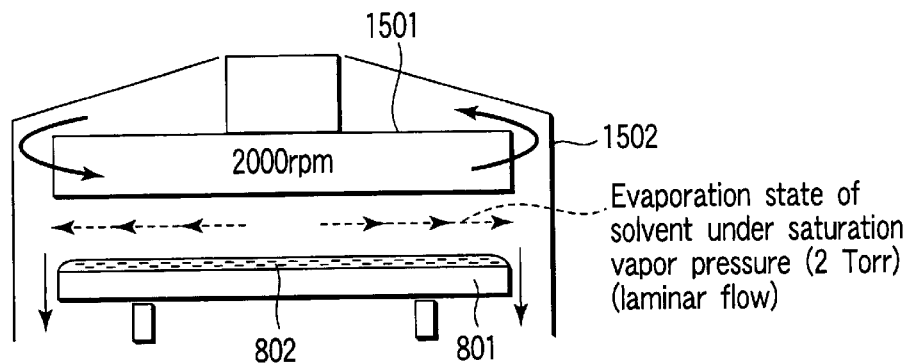
FIG. 17 shows the drying method using the apparatus for drying a liquid film shown in FIG. 15.

In the eighth embodiment of the present invention, however, the solvent vapor is discharged to the peripheral portion of the target substrate under the state of a laminar flow, with the result that the evaporated solvent is prevented from forming a turbulence flow under the saturation vapor pressure, as shown in FIG. 17. It follows that it is possible to suppress the poor uniformity caused by the turbulence flow, making it possible to obtain a coated film of a uniform thickness.

Figure 18:
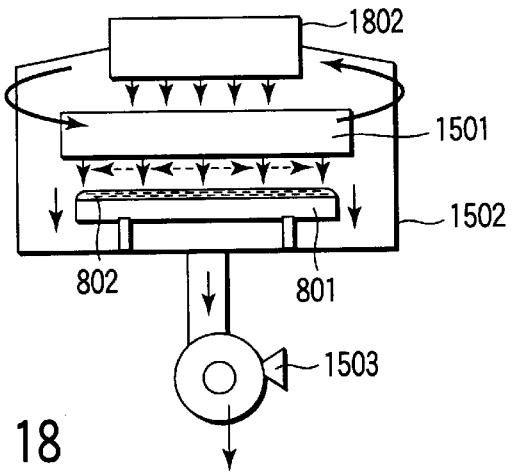
FIG. 18 schematically shows the construction of a modification of the apparatus for drying a liquid film according to the eighth embodiment of the present invention.

In the eighth embodiment of the present invention, used is a disk plate that is not provided with open portions. However, it is also possible to use a disk plate provided with a plurality of holes as in the seventh embodiment described previously. Also, in the eighth embodiment of the present invention, the drying apparatus is of a hermetic structure except that the chamber is connected to the vacuum chamber. However, where the disk plate is provided with holes, it is possible to arrange an gas flow supplier 1802 in the upper portion of the chamber 1502 as shown in FIG. 18 so as to carry out the drying treatment while supplying an gas into the chamber. Also, it is possible to change appropriately the distance between the disk plate and the target substrate, the angular rotating speed of the disk plate, and the degree of vacuum within the chamber depending on the chemical solution used. Further, in the eighth embodiment of the present invention, a scan coating method was employed for forming a liquid film. However, it is also possible to employ other liquid film forming methods including a spiral coating method in which a chemical solution is dispensed spirally from the central portion toward the outer peripheral portion and vice versa.

[Ninth Embodiment]

Figure 19:
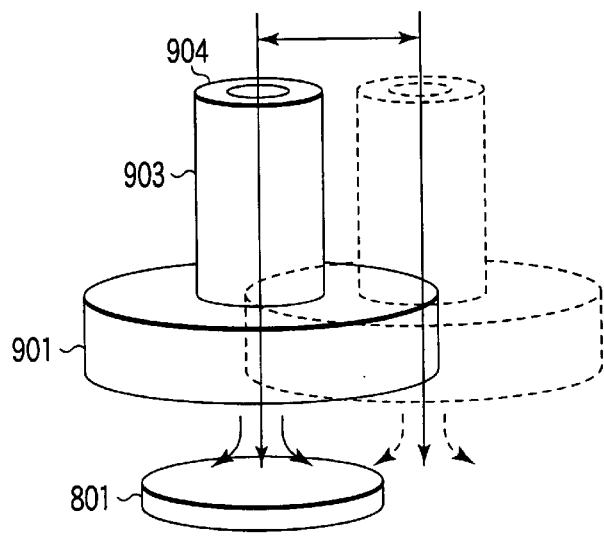
FIG. 19 shows a drying method according to a ninth embodiment of the present invention.

FIG. 19 schematically shows the construction of a drying apparatus according to a ninth embodiment of the present invention. The members of the apparatus common with FIGS. 19 and 9 are denoted by the same reference numerals so as to avoid an overlapping description.

In the first step, the disk plate was moved closer to a position 20 mm apart from the target substrate so as to align the axis of the target substrate with the axis of the disk plate and, then, rotated at an angular speed of 3,000 rpm. In this step, the target substrate was also rotated at 30 rpm in the direction opposite to the rotating direction of the disk plate.

Then, the axis of the disk plate was moved toward the outer periphery of the target substrate at a speed of 10 mm/s. When the axis of the disk plate reached the outer peripheral portion of the target substrate, the axis of the disk plate was moved toward the axis of the target substrate at a speed of 10 mm/s. Such a reciprocating scanning movement was repeated three times so as to carry out the drying treatment of the solvent for 60 seconds in total, thereby forming a resist film having a thickness of 300 nm.

The ninth embodiment differs from the sixth embodiment in that the airflow was kept flowing downward. However, the disk plate and the target substrate were moved relative to each other so as to dry the solvent uniformly over the entire region of the target substrate.

It is possible to prevent a singularity by offsetting the axis of the disk plate and the axis of the target substrate so as to improve the uniformity in the thickness of the coated film. Also, it is possible to further improve the uniformity in the thickness of the coated film by changing with time the amount of the offset. Further, the drying efficiency can be improved by rotating the target substrate together with the disk plate.

In the liquid film drying method according to the ninth embodiment of the present invention, the disk plate was moved. However, it is also possible to move the target substrate or to move both the disk plate and the target substrate. Also, the angular speed of the disk plate and the distance between the disk plate and the target substrate are not limited to 300 rpm and 20 mm, respectively. Of course, it is possible to determine appropriately the angular speed and the distance noted above depending on the chemical solution used. Further, it is possible to set constant the offset amount without changing the offset amount, depending on the cases. Still further, in the ninth embodiment of the present invention, a scan coating method was employed for forming a liquid film. However, it is also possible to employ other liquid film forming methods including a spiral coating method in which a chemical solution is dispensed spirally from the central portion toward the outer peripheral portion and vice versa.

The present invention is not limited to the embodiments described above and can be modified in various fashions within the technical scope of the present invention. For example, it is possible to change the angular speed of the disk plate within a range of between 500 rpm and 4,000 rpm and to change the distance between the target substrate and the disk plate within a range of between 5 mm and 30 mm, as far as the liquid film itself is centrifugally removed from the target substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film-forming method, comprising:

dispensing from a dispenser nozzle a coating solution, which is prepared by adding a solid component to a solvent and controlled to be spread on said substrate in a predetermined range, onto a target substrate to be processed while relatively moving said dispenser nozzle and said target substrate so as to form a liquid film on the entire surface of said target substrate; and forming a coated film after forming the liquid film, including
arranging a sucking nozzle above said target substrate such that the sucking nozzle is not in contact with a surface of the liquid film, and
sucking the solvent vapor right under the sucking nozzle while scanning the target substrate by the sucking nozzle to remove the solvent from the liquid film to leave the solid component on the target substrate.

2. The film-forming method according to claim 1, wherein said solvent is removed while forming said liquid film after the surface of the liquid film formed on said target substrate is flattened and before the liquid film is formed on the entire surface of said target substrate.

3. The film-forming method according to claim 1, wherein the drying treatment applied to the entire surface of said target substrate by the scanning is carried out a plurality of times.

4. The film-forming method according to claim 3, wherein the scanning route of said suction nozzle to said target substrate is the same in the drying treatment carried out a plurality of times.

5. The film-forming method according to claim 3, wherein the scanning route of said suction nozzle relative to said target substrate in the even number-th drying treatment is opposite to the scanning route in the odd number-th drying treatment in the drying treatment carried out a plurality of times.

6. The film-forming method according to claim 3, wherein, depending on the drying state of said liquid film after the previous drying treatment, the distance between said suction nozzle and the surface of said liquid film is changed in the next drying treatment.

7. The film-forming method according to claim 1, wherein a flow of gas is supplied by using a supply nozzle of gas flow connected to an external gas flow supply apparatus onto the liquid film formed on the target substrate, from which the solvent vapor is being sucked through a suction port of said suction nozzle, so as to remove said solvent.

8. The film-forming method according to claim 1, wherein flow of gas is supplied onto the liquid film formed on said target substrate from the forward region in the scanning direction of said suction nozzle relative to said target substrate.

* * * * *